United States Patent
Xu et al.

(10) Patent No.: US 7,586,322 B1
(45) Date of Patent: Sep. 8, 2009

(54) TEST STRUCTURE AND METHOD FOR MEASURING MISMATCH AND WELL PROXIMITY EFFECTS

(75) Inventors: Yanzhong Xu, Santa Clara, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 54 days.

(21) Appl. No.: 11/743,567

(22) Filed: May 2, 2007

(51) Int. Cl.
*G01R 31/26* (2006.01)
*G01R 31/02* (2006.01)

(52) U.S. Cl. ............................ 324/769; 438/14; 438/17; 716/4

(58) Field of Classification Search ................. 324/769; 438/117, 14–18; 716/4
See application file for complete search history.

(56) References Cited

U.S. PATENT DOCUMENTS

| 4,670,861 | A | 6/1987 | Shu et al. |
| 7,089,513 | B2 | 8/2006 | Bard et al. |
| 7,408,372 | B2 * | 8/2008 | Agarwal et al. ............. 324/765 |

OTHER PUBLICATIONS

Quarantelli et al., "Characterization and Modeling of MOSFET Mismatch Of a Deep Submicron Technology", IEEE Int'l Conf. on Microelectronic Test Structures, Mar. 17-20, 2003, pp. 238-243.
Hess et al., "Logic Characterization Vehicle to Determine Process Variation Impact on Yield and Performance of Digital Circuits", Proc. IEEE 2002 Int. Conference on Microelectronic Test Structures, vol. 15, Apr. 2002, pp. 189-196.
Klimach et al., "MOSFET Mismatch Modeling: a New Approach", IEEE Design & Test Computers, pp. 20-29 (2006).
Marcel et al. "Matching Properties of MOS Transistors" IEEE Journal of Solid-State Circuits, vol. 24, No. 5, Oct. 1989, pp. 1433-1440.
Agarwal et al, "Characterizing process variation in nanometer CMOS," EDA Tech Forum, Sep. 2007.
Agarwal et al, Characterizing Process Variation in nanometer CMOS, IBM Corporation, Jun. 4-8, 2007.

* cited by examiner

*Primary Examiner*—Ha Tran T Nguyen
*Assistant Examiner*—Emily Y Chan
(74) *Attorney, Agent, or Firm*—Martine Penilla & Gencarella, LLP

(57) ABSTRACT

The present invention is directed to a test structure and method to determine the effects of the well proximity effect on the gate threshold voltage of FETs at different distances from the edge of the well.

13 Claims, 3 Drawing Sheets

TEST STRUCTURE AND METHOD FOR MEASURING MISMATCH AND WELL PROXIMITY EFFECTS

BACKGROUND

The present invention relates generally to integrated circuit design, and more particularly, relates to a system and method to measure local variation and well proximity effects on integrated circuits.

Traditionally, variations in the operational characteristics of field effect transistors (FETs) occurs even though the FETs array have common designs and are fabricated with common processing conditions, which is generally referred to as mismatch. Mismatch results from either systematic or stochastic (random) effects. In several instances, random mismatch dominates the effects of systemic mismatch and primarily results from local variations in dopant concentrations, mobility, oxide thickness and polysilicon granularity. As a result of mismatch, the operational characteristics of FETs that may vary include gate threshold voltage, Vt, current saturation, Idsat, and transconductance, Gm.

Another well known contributor to dopant concentration mismatch is caused by the well proximity effect (WPE). The WPE causes the gate threshold voltage, Vt, of the FETs to change as a function of the distance from an edge of the well. This occurs during an implant process in which dopant atoms are implanted into a substrate with high energy to form deep retrograde well profiles in furtherance of providing latch-up protection and suppress lateral punch-though that occurs in (FETs). The WPE has been show to affect the threshold voltage of FETs more than one micrometer from the well edge.

Failure to entertain random mismatch or WPE when designing FETs has resulted in FETs being susceptible to electrical noise that may lead to failure of the electronic circuit in which the FETs are formed. Additionally, catastrophic failure has resulted from WPE when designing current mirrors due to the same shifting out of saturation mode as a result of WPE.

As a result, it is desired to examine local variations and WPE by measuring threshold voltage, saturation current and transconductance. The standard deviations of these measurements are used to determine a linear distribution that follows the square root of the transistor width and length for measuring local variation. This is achieved by examining pair of FETs, which due to silicon area limitation, the number of pairs being limited. As a result, statistical significance is achieved by pooling data from multiple pairs of transistors, i.e., dices, and wafers. The data carries information of local variation and die-die variation, i.e. confounding effect. The standard deviations may have considerable variation from wafer to wafer and lot to lot. To ameliorate wafer-to-wafer and lot-to-lot variations proposed have been test structures employing FET arrays have been implemented to characterize local variation. However, periphery circuits are typically needed to access individual transistors to undertake the measurements. At early stages of process development, such a circuit is not readily available.

As a result, a need exists, for providing local variation and WPE measurement techniques.

SUMMARY

It should be appreciated that the present invention can be implemented in numerous ways, such as a process and an assembly. Several inventive embodiments of the present invention are described below.

The present invention is directed to a test structure and method to determine variations in electrical characteristics of field effect transistors formed in a substrate having an initial doped well, defining an initial well edge. The test structure includes an array of the field effect transistors (FETs) each of which has first and second source/drain regions and a gate region, with the first source/drain region being connected in common and the FETs being arranged in a plurality of groups of multiple FETs and a plurality of sets of multiple FETs. The FETs associated with a common group have a gate region connected in common and spaced-apart from the initial well edge a common distance. The common distance associated with the FETs of each of the plurality of groups differs from the common distance associated with the FETs of the remaining groups. The second source/drain region of FETs associated with a common set are connected in common and spaced-apart from the initial well edge a length. The length associated with each of the FETs of the common set differs from the length associated with the remaining FETs of the common set. One of the FETs of the common set is included in the common group. These features facilitate selectively biasing the FETs to determine a gate threshold voltage at which current flows between the first and second source/drain regions by concurrently applying a first voltage to the gate region of each FET of a group of the FETs and applying a second voltage to the first source/drain region of one of the FETs of the group, while connecting the source region of each of the FETs of the group to a common voltage level. These and other aspects of the invention will become apparent from the following detailed description, taken in conjunction with the accompanying drawings, illustrating by way of example the principles of the invention.

DETAILED DESCRIPTION OF THE INVENTION

Figure 1:
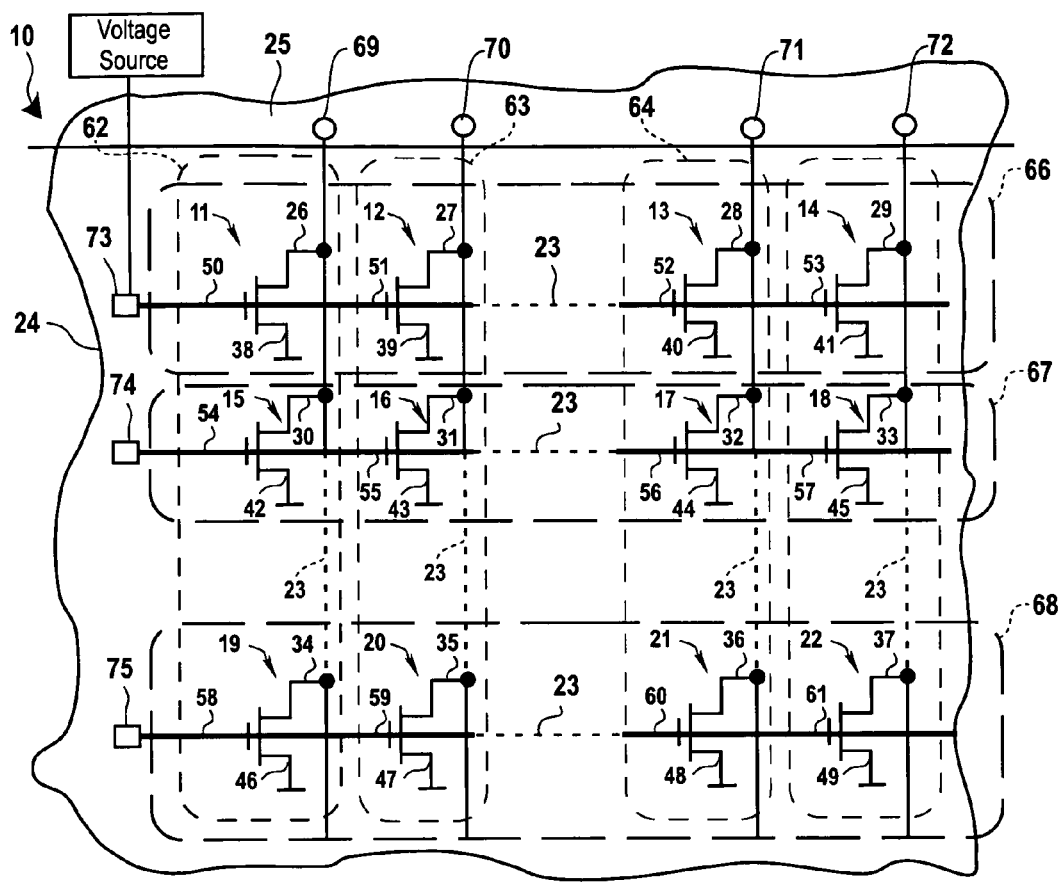
FIG. 1 is a circuit schematic showing of the present invention.

Referring to FIG. 1 a test structure in accordance with one embodiment of the present invention includes an array 10 of transistors which may be of any construction known in the art, such as bipolar and/or field effect transistors (FETs), which are shown as FETs 11-22 with the understanding that the dashed lines 23 represent 88 additional FETs (not shown) coupled together with FETs 11-22 in the manner described below. As a result, array 10 is an example and many more or less FETs may be included in array 10. However, the present embodiment is discussed with respect to 12 FETs 11-22 of array 10 for ease of discussion.

Array 10 is formed in a substrate 24 that is typically fabricated from a semiconductor material and may be any known material suitable for standard semiconductor process including silicon, germanium and the like. A doped well region 25 is included in substrate 24 that may be fabricated from N-type or P-type dopants dependent upon whether FETs 11-22 are n-channel or p-channel FETs. Each of FETs 11-22 has a first source/drain region, shown as 26-37, respectively, and each transistor 11-22 has a second source/drain region, shown as 38-49, respectively. A gate region 50-61 is included in each transistor 11-22, respectively. In the present example, first source/drain regions 26-22 define a drain of FETs 11-22, respectively; and second source/drain regions 38-49 define a source of FETs 11-22, respectively.

Array 10 is interconnected so that a plurality of groups 62-65 of FETs 11-22 and a plurality of sets 66-68 of FETs 11-22 are defined. FETs 11-22 in each of groups 62-65 are coupled such that the drain regions are connected in common for all of the FETs of the group 62-65. In the present example, four groups 62-65 of FETs are shown, with drain regions 26, 30 and 34 of FETs 11, 15, 19 in group 62 connected in common with a contact 69. Drain regions 27, 31 and 35 of FETs 12, 16, 20 in group 63 are connected in common with a contact 70. Drain regions 28, 31 and 35 of FETs 13, 17, 21 in group 64 are connected in common with a contact 71; and drain regions 29, 33 and 37 of FETs 14, 18, 22 in group 65 are connected in common with a contact 72. The gate regions of all FETs 11-22 associated with one of sets 66-68 are connected in common. More specifically, each set 66-68 includes one transistor 11-22 from each of groups 62, 63, 64 and 65 with the gate regions of the FETs being connected in common. As shown, group 66 includes FETs 11-14, with gate regions 50-53, respectively being connected in common with contact 73; and group 67 includes FETs 15-18, with gate regions 54-57 connected in common with contact 74. Group 68 includes FETs 19-22, gate regions 58-61, respectively, being connected in common with contact 75. Source regions 38-49 are connected in common, which as shown as being connected to a ground potential. With this configuration, each of FETs 19-22 may be activated (forward-biased) individually while maintaining the remaining FETs 19-22 of array are in an inactive state, discussed more fully below, which facilitates measuring changes in electrical characteristics of FETs 11-22 as a function of the location of the same in substrate 24. The changes in electrical characteristics may be due to mismatch and/or WPE presented by well 25.

Figure 3:
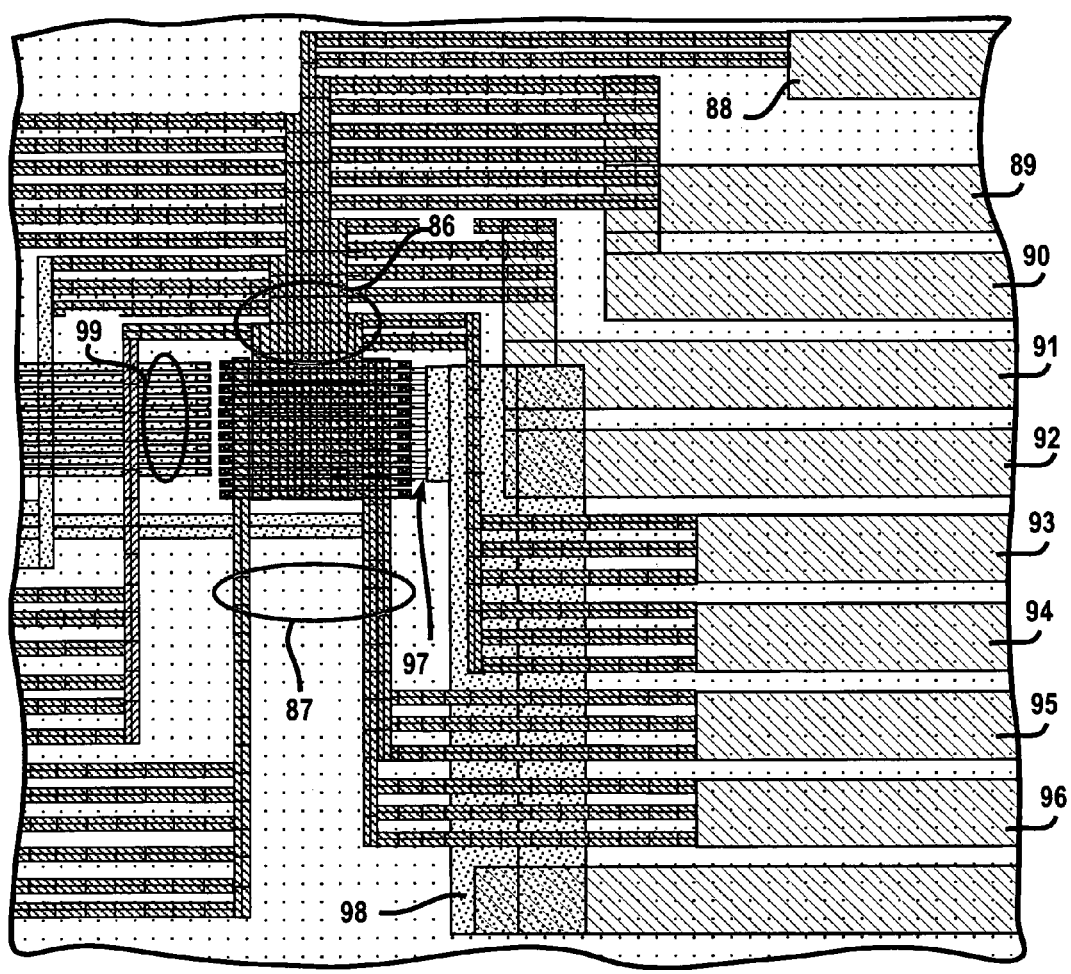
FIG. 3 is top down view showing the layout of the circuit shown FIG. 1 in accordance with one embodiment of the present invention.

Referring to both FIGS. 1 and 3, measurement of mismatch and WPE presented by well 25 is achieved by locating each of FETs 11-22 of array 10 in substrate 24 at a spatial location that differs from the spatial location at which the remaining FETs 11-22 of array 10 is located so that sets 66-68 of FETs 11-22 are located at different distances from an edge 80 of well 25. This facilitates determining, inter alia, effect of the WPE on the Vt of gate regions 50-61 at different distances from edge 80. For example, gate regions 50-53 associated with group 62 are spaced-apart from well edge 80 a distance 81; gate regions 54-57 associated with group 63 are spaced-apart from well edge 80 a distance 82; and gate regions 58-61 associated with group 64 are spaced-apart from well edge 80 a distance 83. As can be seen, distance 83 is greater than either distance 81 or distance 82, with distance 81 being shorter than distance 82. With this arrangement the effect of WPE on the threshold voltage Vt of gate regions 50-61 within any group 62, 63, 64 and 65 may be determined as function of the distance from well edge 80 along direction 84. To that end, FETs associated with any one group 62-65, for example FETs 11, 15 and 19 of group 62 are activated one at a time to determine the Vt at which FETs 11, 15 and 19 operate. Similarly, FETs 12, 16 and 20 of group 63 are activated one at a time to determine the Vt at which FETs 12, 16 and 20. In the same manner FETs 13, 17 and 21 of group 64 and FETs 14, 18 and 22 of group 65 may be activated to determine the Vt at which the same operate.

The effect of WPE on the Vt of gate regions 50-61 along a direction 85, which is transverse to direction 84 may also be determined. This is achieved by activating each of FETs, for example FETs 15-18 one at a time to determine the Vt at which FETs 15-18 operate. This facilitates determining the effect of WPE on the electrical characteristics of FETs along direction 85 at a distance 82 from well edge 80. In a similar manner, FETs, 11-14 of set 66 may be activated one at a time to determine the effect of WPE on the electrical characteristics of array 10 along direction 85 at a distance 81 from well edge 80, and FETs 19-22 of set 68 may be activated one at a time to determine the effect of WPE on the electrical characteristics of array 10 along direction 85 at a distance 83 from well edge 80.

Figure 2:
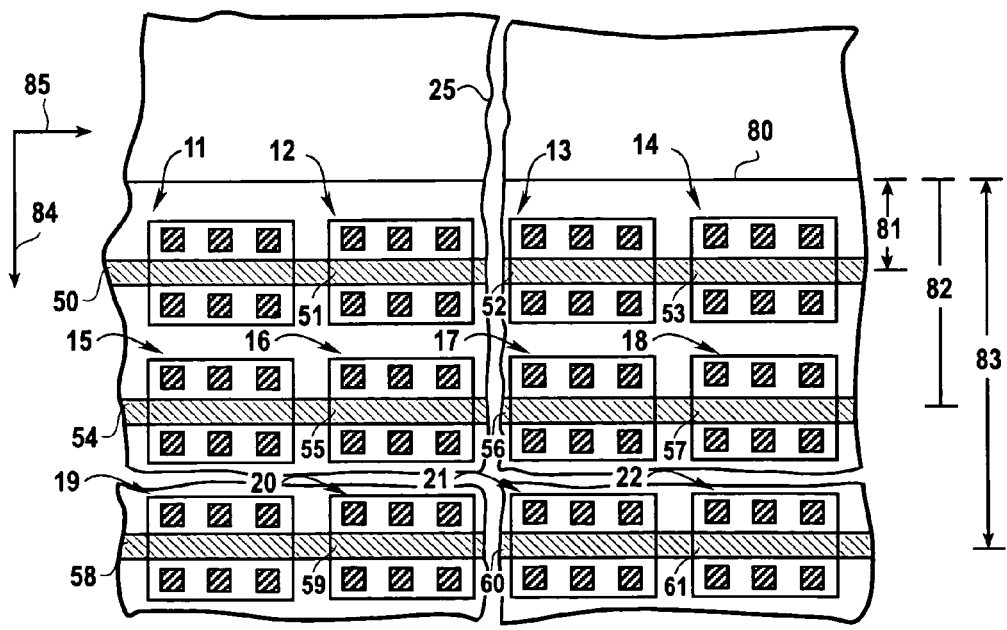
FIG. 2 a top down view showing a partial layout of the circuit shown in FIG. 1 in accordance with the present invention.

Referring to FIGS. 1, 2 and 3 it is desired to avoid an excessive RC drop presented by contacts and the metallization that place contacts in electrical communication with the FETs 11-22 of array 10. To that end, array 10 is constructed to provide adequate metallization so as to avoid excessive resistance to current flow across the contact and the metallization. In the present embodiment, drain region contacts, such as contact 69-72, of array 10 are in superimposition with each of FETs 11-22 and in electrical communication therewith, as well as with groups 86 and 87 of metallization layers. Each of the layers of groups 86 and 87 are approximately one micron wide. The metallization layers of group 86 extend to wider metallization layers, seven of which are shown as 88-94; and the metallization layers of group 87 extend to wider metallization layers, two of which are shown as 95 and 96. Each of metallization layers 88-96 are approximately five times wider than each of the layers associated with groups 86 and 87. As a result, each of metallization layers 88-96 is approximately five microns wide. With this configuration it is believed that an excessive RC drop may be avoided through avoiding undue lengths of one micron wide metallization layers associated with groups 86 and 87 by the present of metallization layers 89-96.

For example, the distance between contact 69 and drain regions 26, 30, and 34 is established to avoid an excessive RC drop across the metallization extending between contact 69 and between drain regions 26, 30, and 34; the distance between contact 70 and drain regions 27, 31, and 35 is established to avoid an excessive RC drop across the metallization extending between contact 70 and drain regions 27, 31, and 35; the distance between contact 71 and drain regions 28, 32, and 36 is established to avoid an excessive RC drop across the metallization extending between contact 71 and drain regions 28, 32, and 36; and the distance between contact 72 and drain regions 29, 33, and 37 is established to avoid an excessive RC drop across the metallization extending between contact 72 and drain regions 29, 33, and 37.

Contacts (not shown) of source regions 34-49 are also in superimposition with array 10, and group 97 of one micron wide metallization layers is in electrical communication therewith. The metallization layers of group 97 are maintained to be a minimum length and connected in common with metallization layer 98 that is nearly ten microns wide in order to avoid an excessive RC drop of current propagating thereacross.

The location of drain region contacts 69-72 and source region contacts (not shown) are constrained by the amount of current drain thereacross, which results in the placement of the same as discussed above. The layout constraints are relaxed with respect to contacts and metallization for gate regions 50-61, due to relatively little current to which the same is subjected. This by contact 73-75 being in juxtaposition with array 10 and group 99 of one micron wide metallization layers extending therefrom.

In operation, FETs 11-22 of array 10 are selectively biased to determine the Vt at which current flows between the source and drain regions of FETs 11-22. To that end, voltages are sequentially applied to the drain regions of each group 62-65, and a range of voltages, referred to as activation/forward bias voltages, are applied sequentially to the gate regions of each of FETs of sets 66-68 included in the group 62-65 to which a the voltage is applied to the drain region. The activation voltage may be applied using techniques known in the art. It should be understood that the voltages are sequentially applied while source regions of array 10 are held at ground. It is desired, however, the only one set of gate regions are subject to the range of activation voltages at any given instance, while ensuring that remaining FETs are deactivated. To that end, all the gate regions of array 10, excepting the gate region being subjected to the range of activation voltages, are maintained at a voltage level in a range of −0.1 to 0.2 voltages, referred to as a range of deactivation voltages. For example, to determine the Vt for gate region 50, drain regions 27, 30 and 34 of set 62 would be biased by application of a voltage in a range of −0.1 volt to Vcc to contact 69, with the drain regions associated with the remaining groups 63, 64 and 65 remaining unbiased, e.g., floating. A range of voltage levels in a range of 0.05V to Vcc would be applied to contact 73 so that gate regions 50, 51, 52 and 53 would be subjected to the activation range of voltages. The gate regions associated with sets 67 and 68 would be biased at a level within the range of deactivation voltage. Thereafter, the drain regions associated with group 63, would be biased by application of a voltage to contact 69, with the drain regions associated with the remaining groups 62, 64 and 65 remaining unbiased, e.g., floating. Gate regions 50-53 would then be subjected to the range of activation voltages allowing determination of the Vt for FET 12. This process would be repeated for groups 64 and 65 to determine the Vt for FETs 13 and 14, respectively. Following determination of Vt for each of FETs 11-14, the Vt for FETs 15-18 associated with set 67 may be determined. To that end, the range of activation voltages would be applied to contact 74, thereby biasing gate regions 54-57, with one of contacts 69, 70, 71 and 72 having a voltage applied thereto to bias the drain regions in electrical communication therewith. For example, to determine the Vt for FET 15, the remaining sets 66 and 68 would have the deactivation voltage applied to the gate regions associated therewith, and a drain bias voltage would by applied to contact 69 to bias the drain regions associated with group 62. In a similar fashion, the Vt for FET 16 may be determined by applying a drain bias voltage to contact 70, thereby biasing the drain regions of group 63 and allowing the drain regions associated with groups 62, 64 and 65 to float. The range of activation voltages would then be applied to contact 74. The aforementioned processes would be repeated so that the Vt for each FET 11-22 of array 10 may be determined. As a result, the Vt variation that result from WPE and/or mismatch on each of FETs 11-22 in array may be determined. Using techniques well known in the art, the saturation current and transconductance of each FET 11-22 may be determined, as well.

Figure 4:
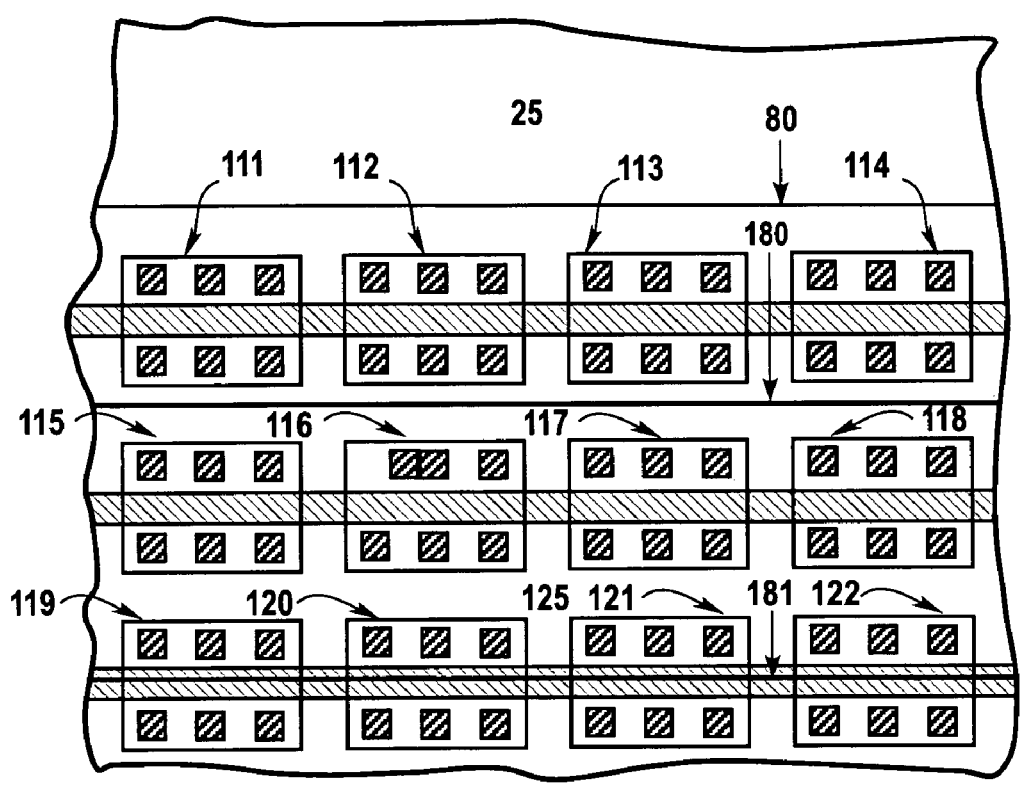
FIG. 4 is a top down view showing the layout of the circuit shown in FIG. 1 in accordance with an alternate embodiment of the present invention.

Although the foregoing invention has been described in some detail for purposes of clarity of understanding, it will be apparent that certain changes and modifications may be practiced within the scope of the appended claims. For example, with reference to FIG. 4, in an alternate embodiment of the present invention the variation in Vt of FETs 111-122 by the WPE of multiple well edges, shown as 80, 180 and 181 may be determined. As shown, well edge 80 is defined by well region 25, as discussed above and well edges 180 and 181 are defined by well region 125 that may be formed in a manner discussed above with respect to well region 25. FETs 111-122 correspond to FETs 11-22 discussed above and the Vt of each may be measured as discussed above. Accordingly, the present embodiments described above are to be considered as illustrative and not restrictive, and the invention is not to be limited to the details given herein, but may defined by the appended claims, including full scope of equivalents thereof.

What is claimed is:

1. A test structure to determine variations in electrical characteristics of field effect transistors formed in a substrate having an initial doped well, defining an initial well edge, said test structure comprising:

an array of said field effect transistors (FETs) each of which has first and second source/drain regions and a gate region, with the first source/drain region being connected in common and said FETs being arranged in a plurality of groups of multiple FETs and a plurality of sets of multiple FETs, with the FETs associated with a common group having a gate region connected in common and spaced-apart from said initial well edge a common distance, with the common distance associated with the FETs of each of said plurality of groups differing from the common distance associated with the FETs of the remaining groups of said plurality of groups, said second source/drain region of FETs associated with a common set being connected in common and spaced-apart from said initial well edge a length, with the length associated with each of the FETs of said common set differing from the length associated with the remaining FETs of said common set, with one of the FETs of said common set being included in said common group, wherein a plurality of contacts are in electrical communication with the first source/drain region, the second source/drain region and the gate region, and wherein one portion of the plurality of contacts is in juxtaposition with the array and another portion of the plurality of contacts is in superimposition with the array.

2. The test structure as recited in claim 1 further including a plurality of contacts, a first subset in electrical communication with the first source/drain region of said FETs and spaced-apart therefrom a first distance and a second subset being in electrical communication with said second source/drain region of said FETs and spaced-apart therefrom a second distance and a third subset being in electrical communication with said gate region of said FETs and spaced-apart therefrom a third distance, with said first distance being less than said second distance and less than said third distances.

3. The test structure as recited in claim 1 further including a plurality of contacts, a first subset being in electrical communication with the first source/drain region of said FETs and in superimposition with said array, and a second subset of said plurality of contacts being in electrical communication with said second source/drain region of said FETs and in juxtaposition with said array, and a third subset of said plurality of contacts being in electrical communication with said gate region of said FETs and in juxtaposition with said array.

4. The test structure as recited in claim 1 further including a voltage source and a plurality of contacts, a first subset being in electrical communication with the first source/drain region of said FETs and spaced-apart therefrom a first distance and a second subset being in electrical communication with said second source/drain region of said FETs and spaced-apart therefrom a second distance and a third subset being in electrical communication with said gate region of said FETs and spaced-apart therefrom a third distance, with said first distance being less than said second distance and less than said third distances, with said voltage source being in electrical communication with said plurality of contacts to selectively bias said FETs, with said first source/drain region having a first current associated therewith and said second source/drain having a second current associated therewith that is less than said first current.

5. The test structure as recited in claim 1 wherein a first voltage is applied to the gate region and a second voltage is applied to the first source drain region.

6. The test structure as recited in claim 1 further including an additional doped well defining an additional well edge spaced apart from said initial well edge, with said initial well edge and said additional well edge defining multiple well edges, with a spacing between the gate regions of the FETs of said common group and any one of the edges of said multiple well edges being substantially identical and the spacing between said any one of the multiple edges and the gate regions associated with FETs of each of the remaining groups of said plurality of groups being different than the spacing between the gate regions of the FETs of said common group and said any one of said multiple well edges.

7. The test structure as recited in claim 6 wherein said second source/drain region of the FETs associated with a common set being connected in common and spaced-apart from said any one of said multiple well edges a length, with the length associated with each of the FETs of said common set differing from the length associated with the remaining FETs of said common set.

8. A test structure to determine variations in electrical characteristics of field effect transistors formed in a substrate having an initial doped well defining an initial well edge, said test structure comprising:

an array of said field effect transistors (FETs) formed into said substrate and spaced-apart from said initial well, with each of said FETs having first and second source/drain regions and a gate region and being located in said substrate at a spatial location that differs from the spatial location at which the remaining field effect transistors of said array is located; and a first group of multiple contacts in electrical communication with said first source/drain region of the FETs of said array, a second group of multiple contacts in electrical communication with said second source/drain region of the FETs of said array, and a third group of multiple contacts in electrical communication with said gate region of the FETs of said array, with said first group being in superimposition with said array and said second and third groups being in juxtaposition with said array.

9. The test structure as recited in claim 8 wherein said FETs are arranged in a plurality of groups of multiple FETs and a plurality of sets of multiple FETs, with the FETs associated with a common group having a gate region connected in common and spaced-apart from said initial well edge a common distance, with the common distance associated with the FETs of each of said plurality of groups differing from the common distance associated with the FETs of the remaining groups of said plurality of groups, said second source/drain region of FETs associated with a common set being connected in common and spaced-apart from said initial well edge a length, with the length associated with each of the FETs of said common set differing from the length associated with the remaining FETs of said common set, with one of the FETs of said common set being included in said common group.

10. The test structure as recited in claim 9 further including an additional doped well defining an additional well edge spaced apart from said initial well edge, with said initial well edge and said additional well edge defining multiple well edges, with a spacing between the gate regions of the FETs of said common group and any one of the edges of said multiple well edges being substantially identical and the spacing between said any one of the multiple edges and the gate regions associated with FETs of each of the remaining groups of said plurality of groups being different than the spacing between the gate regions of the FETs of said common group and said any one of said multiple well edges.

11. The test structure as recited in claim 10 wherein said second source/drain region of the FETs associated with a common set being connected in common and spaced-apart from said any one of said multiple well edges a length, with the length associated with each of the FETs of said common set differing from the length associated with the remaining FETs of said common set.

12. The test structure as recited in claim 8 wherein said first group are spaced-apart from said first source/drain region a first distance and said second group of contacts are spaced apart from said second source/drain region a second distance and said third group are spaced-apart from said gate region a third distance, with said first distance being less than said second distance and less than said third distance.

13. The test structure as recited in claim 12 further including a voltage source in electrical communication with said plurality of contacts to selectively bias said FETs, with said first source/drain region having a first voltage applied thereto and said second source/drain having a second voltage applied thereto that is less than said first voltage.

* * * * *